United States Patent [19]

Quinlan et al.

[11] 4,191,561

[45] Mar. 4, 1980

[54] METHOD FOR THE PRODUCTION OF TRIALUMINUM NICKELIDE FIBERS

[75] Inventors: Kenneth P. Quinlan, Newton; Joseph J. Hutta, Groton, both of Mass.

[73] Assignee: The United States of America as represented by the Secretary of the Air Force, Washington, D.C.

[21] Appl. No.: 968,874

[22] Filed: Dec. 12, 1978

[51] Int. Cl.$^2$ .............................................. C23F 1/02
[52] U.S. Cl. .............................. 75/101 R; 252/79.4; 423/132; 428/611; 75/138
[58] Field of Search ............... 75/101 R, 101 BE, 104, 75/111, 114, 121, 138; 428/611; 156/665, 656; 252/79.4; 423/132, DIG. 14

[56] References Cited

U.S. PATENT DOCUMENTS

| | | | |
|---|---|---|---|
| 3,052,582 | 9/1962 | Snyder et al. | 252/79.4 |
| 3,511,645 | 5/1970 | Goni | 75/101 R |
| 3,594,292 | 7/1971 | Russell et al. | 428/611 |
| 3,729,794 | 5/1973 | Douglass | 428/611 |
| 3,779,839 | 12/1973 | Kaihu et al. | 156/665 |
| 4,100,044 | 7/1978 | Hussey et al. | 204/146 |

FOREIGN PATENT DOCUMENTS 975512  10/1975  Canada ................................. 428/636

OTHER PUBLICATIONS

Prescott, F. J., et al; "Sequestering Agents In Aluminum Etching" *Metal Finishing*, Oct. 1953, pp. 65-67.

*Primary Examiner*—L. Dewayne Rutledge
*Assistant Examiner*—Michael L. Lewis
*Attorney, Agent, or Firm*—Joseph E. Rusz; William J. O'Brien

[57] ABSTRACT

A process for the production of trialuminum nickelide fibers which involves the utilization of an oxalic acid-hydrogen chloride mixture for separating the fibers from a solid, two-phase, composite matrix of aluminum and trialuminum nickelide fibers.

2 Claims, No Drawings

METHOD FOR THE PRODUCTION OF TRIALUMINUM NICKELIDE FIBERS

STATEMENT OF GOVERNMENT INTEREST

The invention described herein may be manufactured and used by or for the Government for governmental purposes without the payment of any royalty thereon.

BACKGROUND OF THE INVENTION

This invention relates to the production of trialumialuminum nickelide fibers. More particularly, this invention concerns itself with a leaching process for removing trialuminum nickelide fibers from a two-phase, composite, aluminum/trialuminum nickelide matrix.

The inclusion of a controlled eutectic alloy of trialuminum nickelide within an aluminum body has proven to be an effective means for providing tensile strength enhancement in aluminum bodies. The trialuminum nickelide filaments are generally grown within the aluminum body as an aligned microstructure in the form of whiskers or filaments. In addition to providing enhanced tensile strength in aluminum bodies, the whiskers of aluminum nickelide also find use in a variety of industrial and military microelectronic applications, provided they can be removed from the aluminum-trialuminum nickelide matrix in an undamaged condition.

A number of methods are presently known for producing aluminum nickelide whiskers in an aluminum matrix. The principal method utilizes a unidirectional solidification technique. Another method involves the growth of aluminum nickelide fiber bundles longitudinally in a rod-shaped aluminum matrix. Still other methods are well known and even newer methods are contemplated since a considerable research effort is being conducted in an attempt to develop even more efficient means of growing these useful fibers. Unfortunately, a fundamental problem exists in the removal and separation of these fiber materials from the two-phase, solid matrix within which they are grown. Therefore, an important need exists for the development of an efficient, practical and simple method for removing the nickelide fibers from the matrix in order to study their effectiveness for various microelectronic applications as well as evaluate the effectiveness of new production procedures which may be conceived of in the future. Also, another problem exists in that the usefulness of these fibers for various microelectronic applications is severely limited unless a method or system can be developed for their removal from the matrix without damage to the fibers. The difficulties encountered in separating the fibers from the solid matrix are due to the similar properties displayed by both the nickelide fibers and the aluminum in the matrix itself. Heretofore, the various separation methods have utilized acid leaching and electrolytic procedures for separating the fiber material. Unfortunately, these prior art methods involved many drawbacks. The acid-leaching procedure had to be precisely timed and the yield proved to be quite low. The electrolytic method required expensive equipment and electricity. Other methods were accompanied by gas evolution resulting in bird-nesting of the fiber bundles as they were exposed. Also, when using aqueous acid etches, a low selectivity of attack constituted a problem since the aluminum nickelide fibers, as well as the bulk aluminum matrix itself, were often dissolved. It became obvious, therefore, that a system which could effect the facile separation of the trialuminum nickelide fibers without damage from the bulk aluminum phase would circumvent the problems encountered in using prior art methods of separation.

After a considerable research effort, the problem of providing an efficient and effective means of separating trialuminum nickelide fibers filaments from a two-phase, composite matrix of aluminum and trialuminum nickelide have been solved by the process of this invention. The aluminum nickelide fibers are separated in extremely good condition using inexpensive chemicals and ambient conditions. In general, the process consists of dissolving the composite matrix with a solution containing oxalic acid and hydrogen chloride.

SUMMARY OF THE INVENTION

In accordance with this invention, a leaching procedure has been discovered which is capable of accomplishing the selective separation of trialuminum nickelide fibers from a solid, two-phase, composite matrix containing containing aluminum and the unaligned microstructure of the eutectic alloy trialuminum nickelide. Separation is achieved by using a leaching solution containing oxalic acid and hydrogen chloride. The process is capable of accomplishing separation of the fibers in extremely good condition using inexpensive chemicals and ambient conditions. The process consists of dissolving the aluminum composite matrix within the leaching solution. The aluminum matrix is dissolved by virtue of the fact that the aluminum forms a soluble complex with oxalic acid. The aluminum complex has the molecular composition $Al(C_2O_4)_3{}^{3-}$. The leaching solution has the outstanding property of not attacking the aluminum nickelide fibers within the time that the composite is being leached by the oxalic acid-hydrogen chloride solution.

Accordingly, the primary object of this invention is to provide an efficient and effective means for bringing about the removal of aluminum from a two-phase matrix consisting of aluminum and trialuminum nickelide filaments.

Another objects of this invention is to provide a novel leaching procedure that selectively dissolves unwanted aluminum from an aluminum/aluminum nickelide filament containing two-phase matrix, leaving the trialuminum nickelide filaments in an undamaged condition.

Still another object of this invention is to provide a leaching procedure for removing aluminum from a two-phase, aluminum-aluminum nickelide matrix that does not produce unacceptable gaseous by products.

A further object of this invention is to provide a process for producing trialuminum nickelide filaments that is simple, efficient, economical and utilizes inexpensive chemicals and ambient conditions that lend themselves to mass production manufacturing techniques.

The above and still further objects and advantages of the present invention will become more readily apparent upon consideration of the following detailed description thereof.

DESCRIPTION OF THE PREFERRED EMBODIMENT

With the above mentioned and other objects in mind, the present invention contemplates a new and improved leaching procedure for removing aluminum from a solid two-phase composite matrix consisting of aluminum and trialuminum nickelide filaments. The process consists of placing the aluminum matrix into a leaching solution containing 2 percent by weight oxalic acid and 0.09 percent by weight hydrogen chloride. The aluminum matrix is dissolved by virtue of the aluminum forming a soluble complex with the oxalic acid. The soluble aluminum complex has the molecular composition $Al(C_2O_4)_3{}^{3-}$. The novel process of this invention is inexpensive and does not require the utilization of any special equipment or electricity. It provides high quality trialuminum nickelide fibers at a very low cost with yields much higher than other competing processes.

In the operation of the process of this invention, the leaching solution is prepared by dissolving 10 grams of oxalic acid and 1.2 milliliters of 37 percent hydrochloric acid in water. This solution is then diluted to a total volumn of 500 milliliters. Any amount of leaching solution can be prepared by having the corresponding amounts of oxalic acid and hydrogen chloride.

Separation of the aluminum nickelide fibers from the aluminum matrix is accomplished by adding ingots of the composite into the leaching solution. The ingots are leached for approximately 60 hours. Heat may be applied to reduce this time requirement leaching time depends upon the size of the ingot. In this particular case, an ingot of approximately 1½ cm×0.2 cm was utilized in effecting the separation of the aluminum nickelide fibers within the 60 hour processing period. At the end of the processing period some fibers have broken loose and the remaining ingot can easily be broken up into the aluminum nickelide fibers. The result is an aqueous solution containing solid trialuminum nickelide fibers. The fibers can be separated and removed from the solution by any conventional or convenient method of separation, such as decanting or the use of a centrifuge. The leaching step can be carried out in any vessel, such as a glass beaker, that is not attacked by the oxalic acid-hydrogen chloride solution.

The successful removal of aluminum from the two-phase matrix of aluminum and trialuminum nickelide fibers in accordance with the process of this invention has been successfully demonstrated. High power microscopy examination of the product illustrates that the procedure provides a preferential leaching of the aluminum matrix leaving well defined trialuminum nickelide fibers. The process uses inexpensive chemicals and equipment and no special type of equipment or electricity is needed to carry out the process.

While the invention has been described with particularity in reference to its specific embodiment thereof it is to be understood that the disclosure of the present invention is for the purpose of illustration only and is not intended to limit the invention in any way, the scope which is defined by the appended claims.

What is claimed is:

1. A process for separating trialuminum nickelide filaments from a solid, two-phase, composite matrix containing aluminum and trialuminum nickelide filaments which comprises the step of placing an ingot of the said aluminum composite into a leaching solution composed of 2 percent by weight oxalic acid and 0.09 percent by weight hydrogen chloride for a period of time sufficient to effect the separation of said trialuminum nickelide filaments from said matrix.

2. A process in accordance with claim 1 wherein said matrix is immersed in said leaching solution for a period of time of about 60 hours.

* * * * *